(12) United States Patent
Phan et al.

(10) Patent No.: US 6,505,313 B1
(45) Date of Patent: Jan. 7, 2003

(54) MULTI-CONDITION BISR TEST MODE FOR MEMORIES WITH REDUNDANCY

(75) Inventors: Tuan Phan, San Jose, CA (US); William Schwarz, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/466,389

(22) Filed: Dec. 17, 1999

(51) Int. Cl.$^7$ ............................................... G11C 29/00
(52) U.S. Cl. ..................................... 714/718; 714/733
(58) Field of Search ........................... 714/7, 711, 718, 714/733, 730; 365/200

(56) References Cited

U.S. PATENT DOCUMENTS

| | | | | |
|---|---|---|---|---|
| 5,764,878 A | * | 6/1998 | Kablanian et al. | 714/7 |
| 5,909,404 A | | 6/1999 | Schwarz | 365/201 |
| 5,920,515 A | * | 7/1999 | Shaik et al. | 365/200 |
| 5,987,632 A | * | 11/1999 | Irrinki et al. | 714/711 |
| 6,085,334 A | * | 7/2000 | Giles et al. | 714/7 |
| 6,178,124 B1 | * | 1/2001 | Kaiser et al. | 365/200 |

* cited by examiner

*Primary Examiner*—David Ton
(74) *Attorney, Agent, or Firm*—Conley, Rose & Tayon

(57) ABSTRACT

A memory device configured to detect changes in fault patterns is disclosed. In one embodiment, the memory device includes a memory array, a built-in self-test (BIST) unit, and a built-in self-repair (BISR) unit. The BIST unit runs test patterns on the memory array to identify faulty locations in the array. A comparator within the BIST or external to the BIST compares the actual output of the memory array to the expected output, and asserts an error signal whenever a mismatch occurs. The BISR unit intercepts addresses directed to the memory array, and operates on the addresses in three distinct phases. During a training phase, the BISR unit stores the intercepted addresses when the error signal is asserted. During the normal operation phase, the BISR unit compares all intercepted addresses to stored addresses and redirects a corresponding memory access if any intercepted address matches a stored address. During a verification phase, the BISR unit compares intercepted addresses designated by assertions of the error signal to the addresses previously stored in the training phase. If the faulty intercepted address fails to match a stored address, the BISR unit asserts a "new error" signal. If at the end of the verification phase, a stored address has not matched nay intercepted faulty address, the BISR asserts a "missed error" signal.

7 Claims, 3 Drawing Sheets

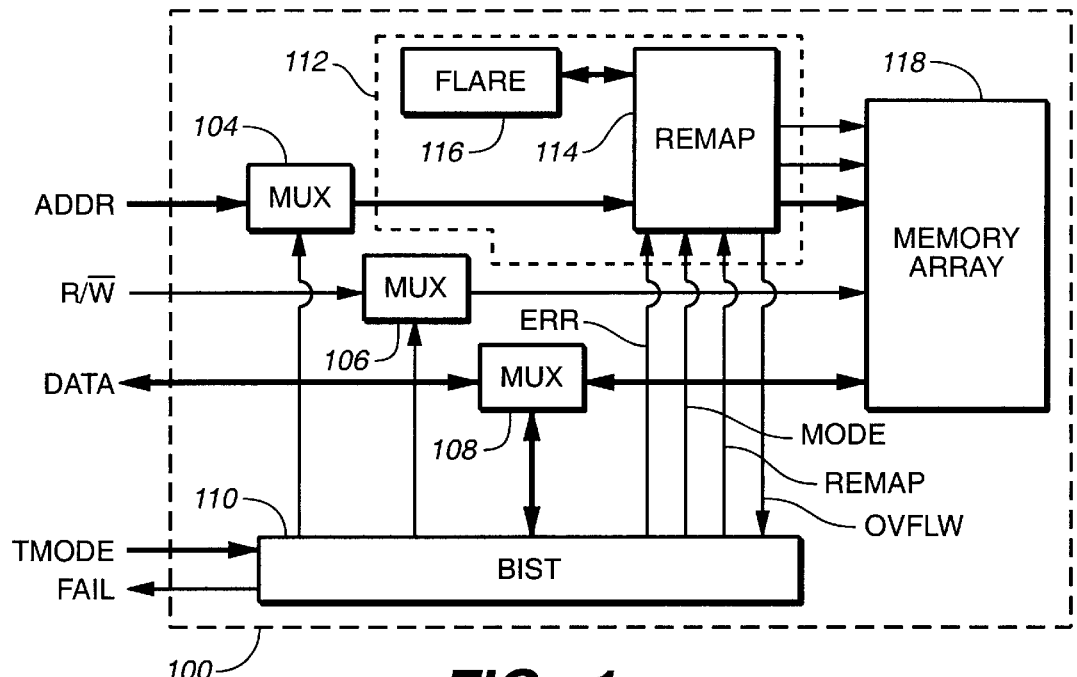
FIG._1
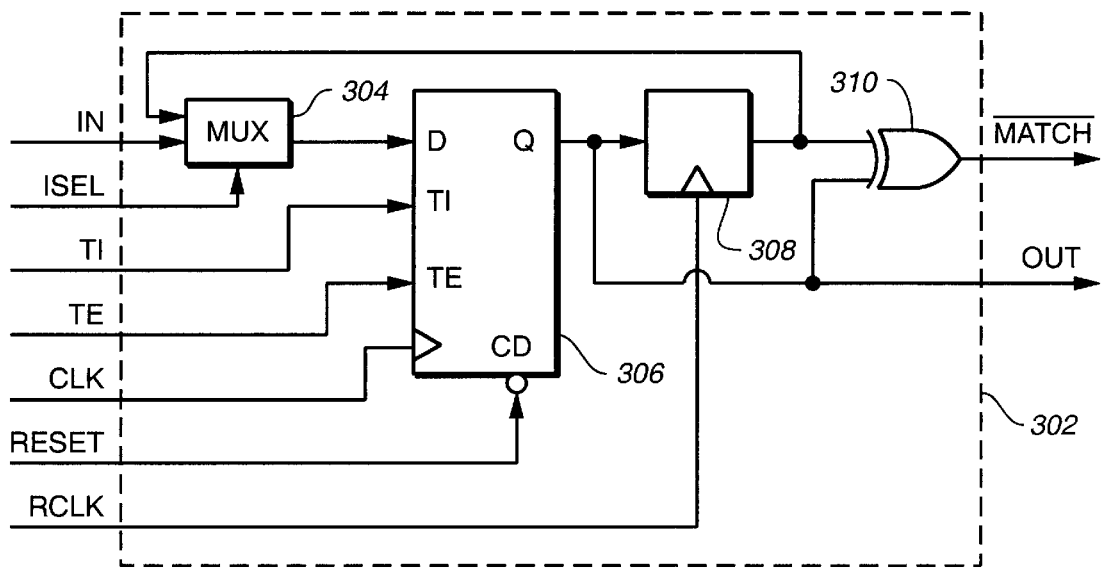
FIG._3

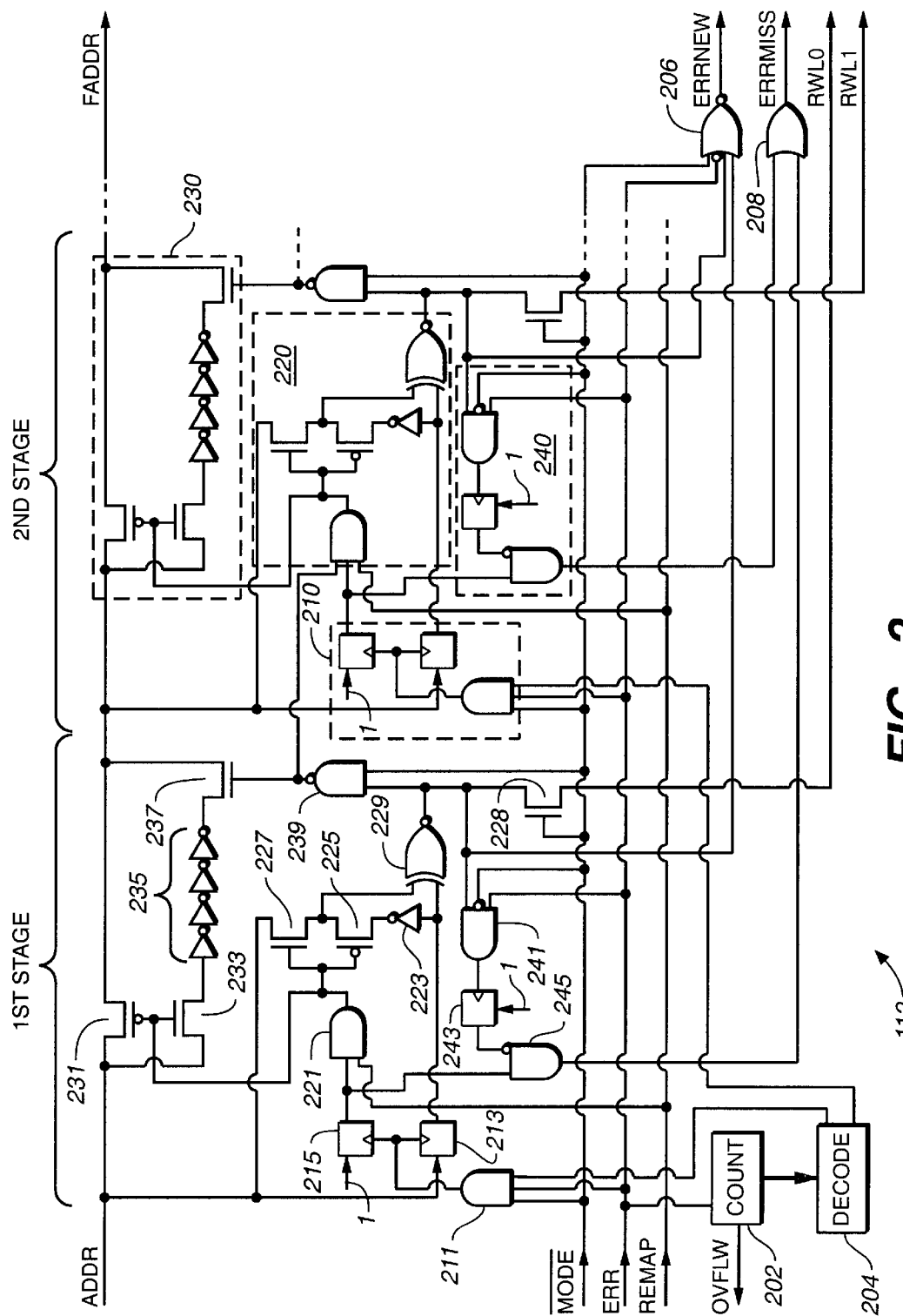
FIG._2

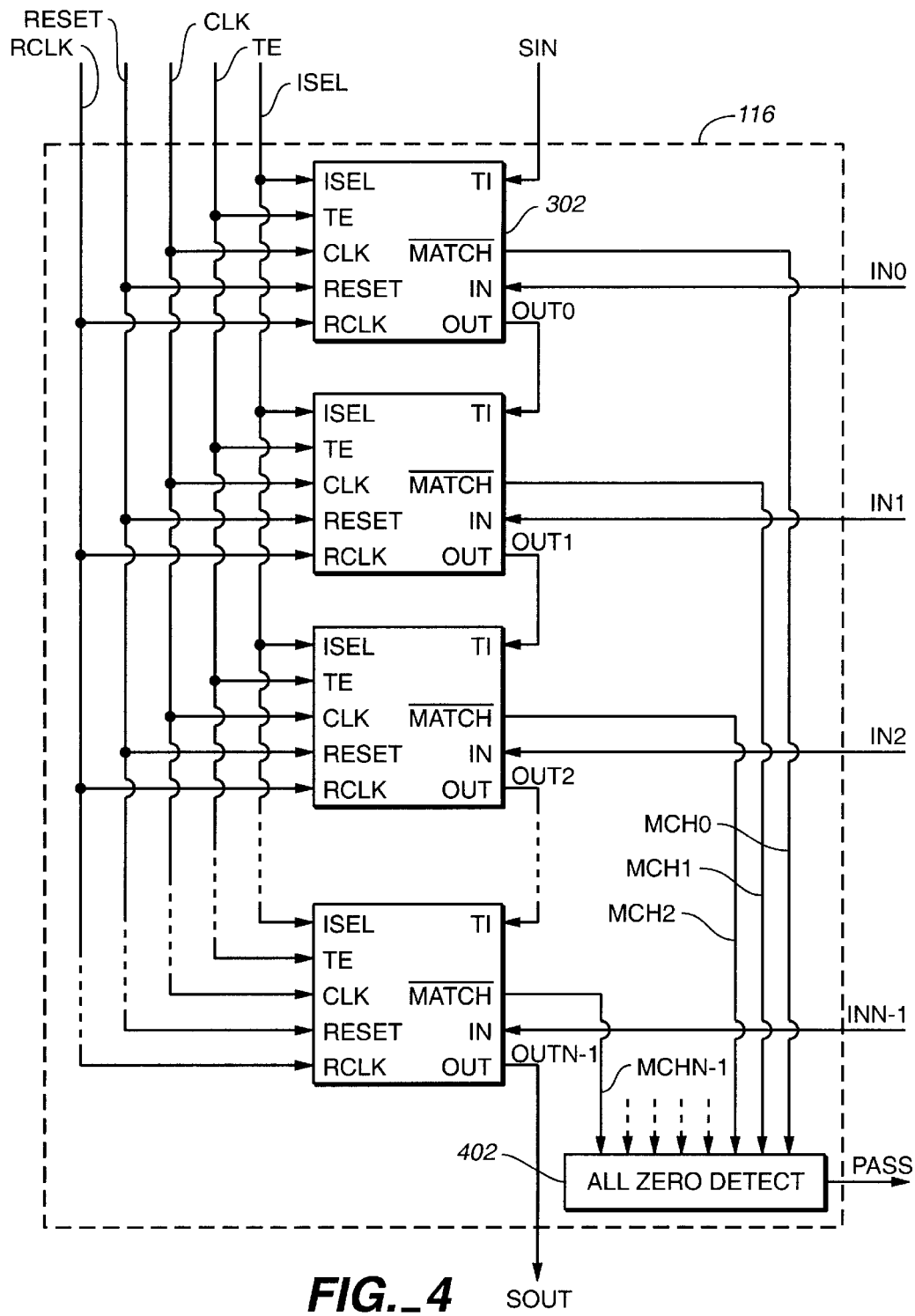
FIG._4

MULTI-CONDITION BISR TEST MODE FOR MEMORIES WITH REDUNDANCY

BACKGROUND OF THE INVENTION

This invention relates to the field of digital electronic memory devices, and in particular to a built-in apparatus and method for enhancing reliability by monitoring repair solution consistency.

Since users generally depend upon the reliability of integrated circuit chips for their own systems to function properly, it is common practice for the chip manufacturers to test the functionality of chips at the manufacturing site before the chips are sold to users. As the line width within a integrated circuit chip continues to shrink, this reliability becomes more difficult to achieve. An ongoing challenge for the manufacturers is to increase circuit density without sacrificing reliability or suffering decreasing chip yields due to malfunctioning parts.

Thus, before memory chips are released for shipment they typically undergo testing to verify that the support circuitry for the memory array and the individual circuitry for each of the memory cells within the memory array is functioning properly. One standard way for testing chip memories involves using an external memory tester or Automatic Test Equipment (ATE) at the manufacturing site. An external memory tester supplies power and applies test patterns to the chip to detect faults. External memory testers can only test a limited number of chips at a time, and the test speed is limited by the external bus speed. Consequently, this method of testing is expensive in terms of time requirements and equipment costs.

Partly to address these issues, and partly to provide off-site testing, built-in self-test (BIST) units are now commonly incorporated into memory chips. Automated test equipment can now be simplified to the extent that the only necessary functions are to supply power (and sometimes a clock signal) to the memory chip, and to monitor a single output signal from the chip. The on-board BIST unit generates all the test patterns and asserts (or de-asserts) the output signal if the chip passes the functionality test. The BIST can be configured to run every time the chip is powered-on, or the BIST may be configured to run only when a test mode signal is asserted.

The BIST unit operates by writing and reading various patterns to/from the memory to determine various kinds of memory faults. In general, a BIST unit writes a data value to a memory cell and subsequently reads the memory cell. By comparing the data written and the data subsequently returned from the memory cell, the BIST unit is able to determine whether the memory cell is faulty. If too many errors are detected, then the fault may exist in the support circuitry.

It is not uncommon for a significant percentage of the memory cells within the chip to fail because of defects in the substrate or errors in the manufacturing process. To compensate for this, many memory chips are provided with a set of extra memory cells that can be used in place of the defective ones. Configuring the memory chip to replace the defective cells is termed "Repairing" the memory array. Some memory repair is performed at the manufacturing site. Conventional repairing techniques bypass the defective cells using fuseable links that cause address redirection. However, these techniques require significant capital investment for implementing the repairing process, and moreover fail to address the possibility of failure after shipment from the manufacturing facility.

To reduce repair costs and allow field repairs, some memory chips have been equipped with built-in self test (BIST) and built-in self repair (BISR) circuitry. The BIST circuit detects faults in the memory array and notifies the BISR circuit of the fault locations. The BISR circuitry generally reassigns the row or column containing the failing cell to a spare row or column in the memory array. BIST and BISR are typically performed each time power is applied to the system. This allows any latent failures that occur between subsequent system power-ups to be detected in the field.

Occasionally, the faults that occur in a memory chip are condition-sensitive. For example, some faulty cells may operate normally at power-up, but cease functioning under normal operating conditions. Other faults may be sensitive to the power supply voltage level. While BIST and BISR circuitry can compensate for these problems, changes in fault patterns of a chip are undesirable and may be symptomatic of underlying manufacturing problems. Consequently, it is desirable to provide a method of screening chips at the factory to detect fault pattern changes.

SUMMARY OF THE INVENTION

Accordingly, there is disclosed herein a memory device configured to detect changes in fault patterns. In one embodiment, the memory device includes a memory array, a built-in selftest (BIST) unit, and a built-in self-repair (BISR) unit. The BIST unit runs test patterns on the memory array to identify faulty locations in the array. A comparator within the BIST or external to the BIST compares the actual output of the memory array to the expected output, and asserts an error signal whenever a mismatch occurs. The BISR unit intercepts addresses directed to the memory array, and operates on the addresses in three distinct phases. During a training phase, the BISR unit stores the intercepted addresses when the error signal is asserted. During the normal operation phase, the BISR unit compares all intercepted addresses to stored addresses and redirects a corresponding memory access if any intercepted address matches a stored address. During a verification phase, the BISR unit compares intercepted addresses designated by assertions of the error signal to the addresses previously stored in the training phase. If the faulty intercepted address fails to match a stored address, the BISR unit asserts a "new error" signal. If at the end of the verification phase, a stored address has not matched any intercepted faulty address, the BISR asserts a "missed error" signal.

BRIEF DESCRIPTION OF THE DRAWINGS

Other objects and advantages of the invention will become apparent upon reading the following detailed description and upon reference to the accompanying drawings in which:

FIG. 1 depicts a functional block diagram of a memory equipped with BIST and BISR according to one embodiment;

FIG. 2 depicts a functional schematic diagram of a first BISR embodiment that detects changes in fault patterns;

FIG. 3 depicts a functional schematic diagram of a FLARE module; and

FIG. 4 depicts a functional block diagram of a BISR component for detecting changes in fault patterns.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

In the following description, the terms "assert" and "de-assert" are used when discussing logic signals. When a logic signal is said to be asserted, this indicates that an active-high signal is driven high, whereas an active-low signal is driven low. Conversely, de-assertion indicates that an active-high signal is driven low, and that an active-low signal is driven high. As used herein, the term "BIST" refers to the actual test, while "BIST unit" and "BIST circuitry" refer to the circuitry that performs BIST. Similarly, "BISR" refers to the process of built-in self repair, while "BISR unit" and "BISR circuitry" refer to the circuitry that performs BISR.

DETAILED DESCRIPTION OF THE INVENTION

Turning now to the figures, FIG. 1 shows a memory 100 having a set of signal lines that includes an address bus (ADDR), a read/write line (R/W), a bi-directional data bus (DATA), a test mode bus (TMODE), and a fail line (FAIL). A set of multiplexers 104, 106, and 108 allows a BIST unit 110 to take control of the ADDR, R/W, and DATA lines, respectively, when the TMODE bus includes an asserted test signal. The ADDR lines from multiplexer 104 connect to BISR circuit 112, and from there to an address decoder in memory array 118. When provided with an address, the address decoder asserts a word line to access cells in memory cell array 118 that correspond to the value on the address lines. If the R/W line is asserted, the data from the accessed cells is driven onto the DATA lines. Otherwise, the binary values on the DATA lines are stored into the accessed cells.

BISR circuit 112 is provided to detect and block addresses of faulty cells, and to assert a replacement word line to access redundant cells to replace the faulty cells in the memory cell array. The BISR 112 circuit is preferably also configured to detect changes in fault patterns. The BISR circuit 112 may be considered as an undivided unit 112 or as a memory unit 116 and a remapping unit 114. In one embodiment of the invention is shown in terms of an undivided BISR unit 112, and a second embodiment is shown in terms of memory unit 116. Both embodiments are discussed further below.

When a test signal is asserted, the BIST unit 110 takes control of the ADDR, R/W, and DATA lines, and conducts a pattern of read and write operations designed to detect faults in the memory cell array. During write operations, the BIST unit 110 supplies test data to the memory cell array on the DATA lines. During read operations, the BIST unit 110 receives data from the memory cell array and compares it to the expected output data. When a mismatch is detected, BIST unit 110 asserts an error signal line (ERR).

Referring momentarily to FIG. 2, the BISR unit 112 includes a counter 202 which increments an error count every time the ERR line is asserted. Counter 202 also produces an overflow signal (OVFL) that is asserted when the number of detected errors exceeds the number of redundant memory words available. Upon detecting assertion of the OVFL signal, BIST unit 110 (FIG. 1) ceases testing and holds the FAIL line in an asserted state. If the testing completes without assertion of the OVFL signal, BIST unit 110 de-asserts the FAIL line.

In memory 100, the repair unit 112 is configured to remap faulty rows as they are detected. Consequently, faulty rows are replaced by potentially un-initialized rows in the middle of testing. The BIST unit 110 prevents the potentially incorrect values stored in a replacement row from manifesting as an error in any subsequent accesses to the address where the error was detected. In one embodiment, the BIST unit 110 is configured to write a suitable value to the address after the replacement occurs and before proceeding with the testing. In another embodiment, the BIST unit 110 tracks the faulty addresses and disables the result comparisons during subsequent reads from the faulty addresses. In yet another embodiment, the BIST unit 110 re-starts the test after a row is replaced. In any case, the FAIL signal should not be de-asserted until the BIST unit 110 has performed a complete test without detecting any faults. Accordingly, if one or more faults is detected and repaired during a test, the BIST unit should repeat the test to verify the functionality of the repairs.

Memory 100 may alternatively be configured to allow BIST unit 110 to locate all the defects in memory cell array 118 before attempting any repairs. This configuration allows for determination of an optimal remapping solution when both columns and rows are being replaced, but requires a significantly more complex BIST unit implementation.

The phase of operation in which the BIST locates faults and configures the BISR to remap the faulty addresses to redundant memory locations is hereafter referred to as the training phase of the BISR unit. At some point subsequent to the training phase, the BIST unit will conduct a fault pattern verification test. In the fault pattern verification test, the BIST unit 110 will repeat its actions of the training phase. However, the BISR unit 112 retains some memory of the faults detected in the training phase, and compares them the faults detected by the BIST unit 110 in the fault pattern verification phase. Any difference between the sets of detected faults is identified by the BISR unit 112.

Referring now to FIG. 2, BISR unit 112 receives address bus ADDR, test mode signal (MODE\), error signal ERR, and remap signal REMAP. The MODE\ signal is active low, and is asserted low during the verification phase to verify fault pattern consistency. The remainder of the time (during the training phase and during normal operation), the MODE\ signal is de-asserted (high) to allow training of the BISR circuit and remapping by the BISR circuit. During training, the BISR circuit stores the addresses of detected fault locations. The BIST unit asserts the ERR signal during detection of a faulty address, and REMAP signal is asserted to cause the repair circuit 112 to remap those faulty addresses it has stored. In response to these signals, the BISR circuit provides a filtered address bus FADDR, redundant word line signals RWLx, a new error detect signal (ERRNEW), and a missing error detect signal (ERRMISS). The BISR circuit either passes the ADDR bus value on to the FADDR bus, or the BISR circuit blocks the value if the value matches a stored faulty address and asserts one of the RWLx signals to replace the faulty location. The ERRNEW signal is asserted if a new, unlatched error is found, and the ERRMISS signal is asserted if one or more previously latched errors are not found by a subsequent BIST.

Repair circuit 112 includes counter 202, decoder 204, a series of stages (one for each redundant word in the memory), and logic gates 206, 208. Counter 202 provides an error count to decoder 204. Decoder 204 asserts a signal line to the signal stage that corresponds to the error count value (an error value of zero causes the signal line to the first stage to be asserted).

Each of the stages can be understood in terms of four functional blocks: storage block 210, comparison block 220, filter block 230, and tracking block 240. Storage block 210 includes logical AND gate 211, address latch 213, and status latch 215. Logical AND gate 211 receives the MODE\ signal, the ERR signal, and a signal from decoder 204. If all three are high, i.e. the BISR is being trained, an error is detected, and the decoder 204 is asserting the signal line for the current stage, the logical AND gate 211 provides a clock transition to address latch 213 and status latch 215. The address latch 213 stores the value on address bus ADDR, and the status latch 215 goes high to indicate that an address has been latched in the current stage.

Comparison block 220 includes logical AND gate 221, inverter 223, P-type transistor 225, N-type transistor 227, and inverted XOR gate 229. Logical AND gate 221 receives the REMAP signal, the output of the status latch 215, and an inverted blocking signal from a preceding stage. If all three are asserted, i.e. BISR remapping is enabled, an address is latched, and the preceding stage is not blocking the ADDR bus, then gate 221 asserts a switch signal.

Before the switch signal is asserted, transistor 225 couples an inverted address latch signal from inverter 223 to inverted XOR gate 229. Since the other input of the inverted XOR gate 229 is the non-inverted address latch signal, this causes the inverted XOR gate 229 to register a mismatch and drive a match signal low. After the switch signal is asserted, transistor 225 isolates the inverter from inverted XOR gate 229 and transistor 227 couples the ADDR bus signal to inverted XOR gate 229. This causes inverted XOR gate 229 to drive the match signal high only if the ADDR bus signal matches the latched address signal. If the MODE\ signal line is de-asserted (i.e. high) to indicate training or normal operation, the match signal is coupled to a redundant word line by a transistor 228.

Filter block 230 includes bypass transistor 231, stage input transistor 233, delay chain 235, and blocking transistor 237. The ADDR bus is coupled to bypass transistor 231, and when the switch signal from comparison block 220 is de-asserted, the signals on the ADDR bus are routed through to the FADDR output bus. When the switch signal is asserted, the bypass transistor 231 stops conducting and stage input transistor 233 couples the ADDR bus signals via delay chain 235 to blocking transistor 237. Blocking transistor 237 receives the inverted blocking signal from logical NAND gate 239, and when the blocking signal is asserted (low), the blocking transistor 237 isolates the ADDR bus signals from the FADDR output bus. The blocking signal is asserted only when the comparison block drives the match signal high and the MODE\ signal is not indicating a fault pattern verification phase.

Tracking block 240 includes a logical AND gate 241, a tracking latch 243, and a second AND gate 245. Logical AND gate 241 receives the match signal from inverted XOR gate 219, an inverted MODE signal, and the error signal. If all are high, i.e. if an error is detected at a location that matches the latched address while in the pattern verification phase, logical AND gate 241 clocks tracking latch 243, causing it to latch a "hit" signal high. Second AND gate 245 normally provides an asserted "miss" signal if the status latch is high and the tracking latch is low, but when the tracking latch goes high, the miss signal is turned off.

Logic gate 206 is a NOR gate coupled to receive the MODE\ signal, an inverted ERR signal, and the match signals from each stage. Only if these are all simultaneously low, i.e. the ERR signal is asserted during the pattern verification stage and none of the match signals is asserted, is the ERRNEW signal asserted to indicate the detection of an error not found in the training phase. Logic gate 208 is a logical OR gate coupled to receive the miss signals from each stage. If any of the miss signals remains asserted after the end of the pattern verification phase, then an error detected in the first phase did now occur in the second phase, and the continued assertion of the ERRMISS signal indicates this.

Moving now the second embodiment, FIG. 3 shows a modular element of a BISR circuit memory module 116. The element 302 is configured to store faulty address locations and compare the stored faulty addresses with newly-detected faulty addresses. Element 302 includes a multiplexer 304, an address latch 306, a reserve latch 308, and a compare gate 310. Multiplexer 304 receives a output signal from the reserve latch, an input signal (IN), and an input select signal (ISEL). The output of the multiplexer 304 is provided as an input (D) to address latch 306. Address latch 306 also receives a shift input signal (TI), a shift enable signal (TE), a clock signal (CLK), and a reset signal (RESET). When the shift enable signal (TE) and the reset signal (RESET) are de-asserted, a clock pulse causes the address latch 306 to store the value of the input signal (D) and provide it as output signal (OUT). When the shift enable signal (TE) is asserted and the reset signal is de-asserted, a clock pulse causes the address latch to store the value of the shift input signal (TI). Assertion of the reset signal causes the output signal to be reset low.

Reserve latch 308 receives the output signal from the address latch and a reserve clock signal (RCLK). A pulse in the reserve clock signal causes the reserve latch 308 to store the output signal from the address latch. If the ISEL signal is subsequently de-asserted and the CLK signal pulsed, the contents of the reserve latch 308 may be moved back to the address latch 306. Compare gate 310 performs an exclusive-OR comparison of the contents of the address and reserve latches, and drives a match signal (MATCH) low if they are the same.

FIG. 4 shows how the modular elements are coupled together. Each of the N bits (IN0 through INN-1) in an address are directed to a corresponding module 302. During a training phase, the ISEL signal is asserted, the TE signal and the RESET signals are de-asserted. As a faulty address is detected, it is latched into address latch 306 (FIG. 3) by a pulse of the CLK signal. The configuration of FIG. 4 can only store a single faulty address, but multiple copies of this configuration may be provided to allow for storing multiple faulty addresses. At the end of the training phase, the faulty address bits are moved to the reserve latch 308 (FIG. 3) by a pulse of the RCLK signal, and the RESET signal is asserted to clear the address latches.

During the verification phase, the faulty address bits are again latched into the address latch 306. If the faulty addresses stored in the training phase match the faulty addresses stored in the verification phase, all of the MATCH\ output signals will be asserted low, and all-zero detector 402 asserts a pass signal (PASS) to indicate this. Otherwise, one or more of the MATCH\ signals is de-asserted, causing the all-zero detector 402 to de-assert the PASS signal.

The OUT signal from each module 302 is coupled to the shift input signal of the subsequent module. This forms a shift chain that allows the latch contents to be scanned out for off-chip examination. To shift the address latch contents out via the SOUT output, the shift enable signal TE is asserted, and the CLK signal is repeatedly pulsed. Once the address latch contents have been completely shifted out, the contents of the reserve latches can be moved to the address latches (by de-assertion of the TE and ISEL signals and a pulsation of the CLK signal) and similarly scanned out for off-chip examination.

Numerous variations and modifications will become apparent to those skilled in the art once the above disclosure is fully appreciated. For example, while the description is directed to memory arrays, the BIST and BISR units are readily adaptable to other reconfigurable electronic systems having redundant portions. It is intended that the following claims be interpreted to embrace all such variations and modifications.

What is claimed is:

1. A device which comprises:
   a reconfigurable component having redundant portions;
   a built-in self-test (BIST) unit coupled to the reconfigurable component and configured to test the reconfigurable component to identify faulty portions of the reconfigurable component; and
   a built-in self-repair (BISR) unit configured to store identifiers of the faulty portions and coupled to the reconfigurable component to configure the redundant portions to operate in lieu of the faulty portions,
   wherein the BIST unit is further configured to retest the reconfigurable component anew to identify faulty portions of the reconfigurable component at a subsequent time, wherein the BISR unit is further configured to receive subsequent identifiers of the faulty portions, and wherein the BISR unit is configured to compare the subsequent identifiers to the stored identifiers to identify any discrepancies;
   wherein said subsequent identifiers are stored by the BISR unit in a shift chain, and wherein the BISR unit is configurable to serially shift the contents of the shift chain to one or more external pins for off-chip examination; and
   wherein the stored identifiers are addresses stored in reserve latches, and wherein the subsequent identifiers are addresses stored in address latches, and the BISR unit includes logical XOR gates that perform bit-wise comparisons between the contents of the reserve and address latches to provide corresponding match signals to a detector that detects simultaneous assertion of all said match signals.

2. The device of claim 1, wherein the BISR unit is configured to assert a signal to indicate whether a discrepancy exists between the stored identifiers and the subsequent identifiers.

3. A memory device which comprises:
   a memory array;
   a BIST unit coupled to said memory array and configured to test said memory array to identify faulty locations in said array, wherein said faults are identified by assertion of an error signal; and
   a BISR unit coupled to said memory array and configured to intercept addresses directed to said memory array, wherein during a training phase, the BISR unit is configured to store the intercepted addresses when the error signal is asserted, wherein during normal operation, the BISR unit is configured to compare all intercepted addresses to stored addresses to redirect a corresponding memory access if any intercepted address matches a stored address, and wherein during a verification phase, the BISR unit is configured to compare intercepted addresses designated by assertions of the error signal to addresses stored in the training phase;
   wherein the BISR unit comprises:
      a counter coupled to receive the error signal and configured to increment an error count only when the error signal is asserted;
      a decoder coupled to the counter to receive the error count, and configured to assert a decoder signal line that corresponds to the error count;
      one or more redundant location stages each coupled to receive the error signal and a corresponding decoder signal line; and
      a logic gate coupled to each of the stages and configured to assert a "new error" signal if none of said stages indicates a match between an intercepted address and a stored address during assertion of the error signal in the verification phase.

4. The memory device of claim 3, further comprising:
   a second logic gate coupled to each of the stages and configured to assert a "missed error" signal if at least one of said stages indicates a stored address failed to match at least one intercepted address designated by assertion of the error signal.

5. The memory device of claim 3, wherein each stage includes:
   a storage module configured to store the intercepted address during the training phase if the error signal and the corresponding decoder signal line are asserted; and
   a comparison module configured to receive the intercepted address and coupled to the storage module to receive the stored address, wherein the comparison module is configured to assert a match signal when the intercepted address matches the stored address,
   wherein said logic gate is configured to generate said new error signal responsive to the match signals from each stage, the error signal, and a mode signal.

6. The memory device of claim 5, wherein each stage further comprises:
   a tracking module configured to receive the match signal and configured to latch a "hit" signal if the match signal and the error signal are asserted during the verification phase.

7. The memory module of claim 6, wherein each stage further comprises:
   an address filter module configured to delay the intercepted address while the comparison module generates the match signal, and further configured to block the intercepted address signal if the comparison module asserts the match signal outside the verification phase.

* * * * *